(12) United States Patent
Iwagami et al.

(10) Patent No.: US 12,143,025 B2
(45) Date of Patent: Nov. 12, 2024

(54) INVERTER DEVICE, MOTOR UNIT, AND VEHICLE

(71) Applicant: Nidec Elesys Corporation, Kawasaki (JP)

(72) Inventors: Naoki Iwagami, Kawasaki (JP); Yuuki Uchio, Kawasaki (JP)

(73) Assignee: NIDEC ELESYS CORPORATION, Kanagawa (JP)

( * ) Notice: Subject to any disclaimer, the term of this patent is extended or adjusted under 35 U.S.C. 154(b) by 372 days.

(21) Appl. No.: 17/515,807

(22) Filed: Nov. 1, 2021

(65) Prior Publication Data

US 2022/0158567 A1 May 19, 2022

(30) Foreign Application Priority Data

Nov. 19, 2020 (JP) ................. 2020-192285

(51) Int. Cl.
*H02M 7/00* (2006.01)
*H05K 7/14* (2006.01)
*H05K 7/20* (2006.01)

(52) U.S. Cl.
CPC .......... *H02M 7/003* (2013.01); *H05K 7/1432* (2013.01); *H05K 7/20927* (2013.01)

(58) Field of Classification Search
CPC ...... H02M 7/003; H02M 7/48; H05K 7/1432; H05K 7/20927
See application file for complete search history.

(56) References Cited

U.S. PATENT DOCUMENTS

2014/0168901 A1* 6/2014 Ide ................. H01L 23/49575
361/717

FOREIGN PATENT DOCUMENTS

| JP | 2017108524 | * | 6/2017 | ............. H01L 23/36 |
| JP | 2017108524 A | * | 6/2017 | ............. H01L 23/36 |

* cited by examiner

*Primary Examiner* — Jue Zhang
*Assistant Examiner* — Afework S Demisse
(74) *Attorney, Agent, or Firm* — Keating & Bennett, LLP (57) ABSTRACT

One aspect of an inverter device of the present disclosure includes a capacitor module having a capacitor element and a capacitor case that houses the capacitor element, and a housing having a housing space for housing the capacitor module. The housing includes a wall portion that is provided with a flow path through which a refrigerant flows and a first opening portion that allows a part of the flow path to open toward the housing space. The capacitor case includes a heat transfer portion that is made of metal and configured to cover the first opening portion. The refrigerant flows between an inner wall surface of the first opening portion and the heat transfer portion.

9 Claims, 5 Drawing Sheets

INVERTER DEVICE, MOTOR UNIT, AND VEHICLE

CROSS-REFERENCE TO RELATED APPLICATIONS

The present invention claims priority under 35 U.S.C. § 119 to Japanese Patent Application No. 2020-192285 filed on Nov. 19, 2020, the entire content of which is incorporated herein by reference.

FIELD OF THE INVENTION

The present disclosure relates to an inverter device, a motor unit, and a vehicle.

BACKGROUND

Inverter devices have been developed as control devices for motors of electric vehicles or hybrid vehicles. The inverter devices include heat generating components, so that these components are required to be appropriately cooled. For example, conventionally, a power conversion device provided with a cooler through which cooling water flows is known. This cooler directly cools a power semiconductor module and cools a capacitor module using a heat transfer plate.

Conventional inverter devices are not configured to allow a refrigerant to directly cool a capacitor. Cooling efficiency needs to be increased as compared with a method for cooling a capacitor module using another member.

SUMMARY

One aspect of an inverter device of the present disclosure includes a capacitor module having a capacitor element and a capacitor case that houses the capacitor element, and a housing having a housing space for housing the capacitor module. The housing includes a wall portion that is provided with a flow path through which a refrigerant flows and a first opening portion that allows a part of the flow path to open toward the housing space. The capacitor case includes a heat transfer portion that is made of metal and configured to cover the first opening portion. The refrigerant flows between an inner wall surface of the first opening portion and the heat transfer portion.

The above and other elements, features, steps, characteristics and advantages of the present disclosure will become more apparent from the following detailed description of the example embodiments with reference to the attached drawings.

DETAILED DESCRIPTION

Hereinafter, an inverter device 1 according to an example embodiment of the present disclosure will be described with reference to the drawings. In the following drawings, each structure may be different in contraction scale, number, or the like from an actual structure for easy understanding.

In the following description, the direction of gravity is defined based on a positional relationship when the inverter device 1 is mounted on a vehicle located on a horizontal road surface. Although the inverter device 1 is in an attitude in the present specification, the attitude is an example, and thus an actual attitude of the inverter device 1 attached is not limited.

In the drawings, an XYZ coordinate system is illustrated appropriately as a three-dimensional orthogonal coordinate system. In the XYZ coordinate system, a Z-axis direction corresponds to a vertical direction (i.e., an up-down direction), and a +Z direction points upward (i.e., a direction opposite to the direction of gravity), while a −Z direction points downward (i.e., the direction of gravity). An X-axis direction is orthogonal to the Z-axis direction and shows a front-rear direction of the vehicle in which the inverter device 1 is mounted. A Y-axis direction is orthogonal to both the X-axis direction and the Z-axis direction, and is a width direction (i.e., a right-left direction) of the vehicle.

Figure 1:
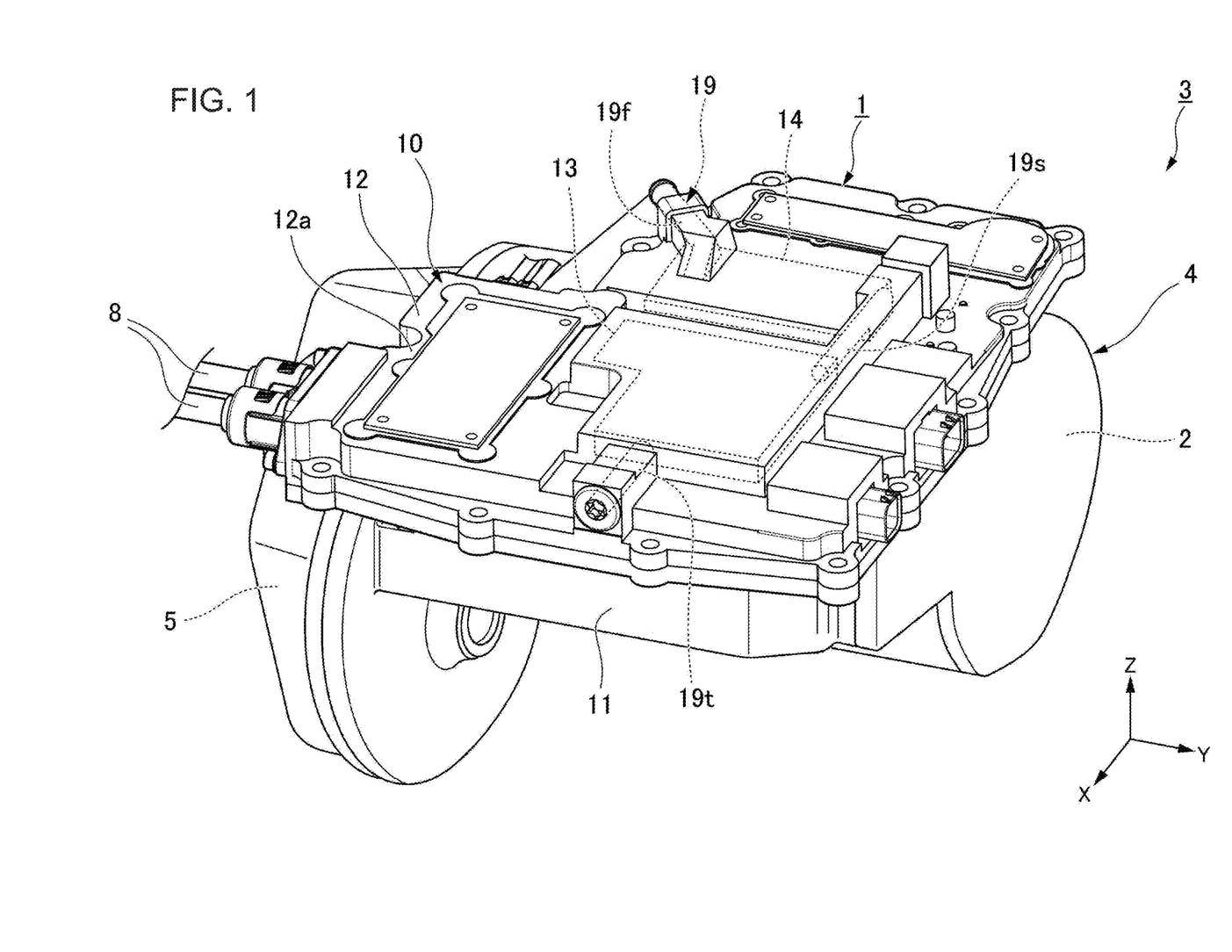
FIG. 1 is a perspective view of a motor unit on which an inverter device according to an example embodiment is mounted.

FIG. 1 is a perspective view of a motor unit 3 on which the inverter device 1 is mounted.

The motor unit 3 includes the inverter device 1, a motor 2, a motor housing 4, and a speed reducer 5.

The motor unit 3 of the present example embodiment is mounted on the vehicle having a motor as a power source, such as a hybrid electric vehicle (HEV), a plug-in hybrid vehicle (PHV), or an electric vehicle (EV), and is used as the power source thereof.

The motor housing 4 houses therein the motor 2 and the speed reducer 5. The inverter device 1 is fixed to an outer surface of the motor housing 4. The motor 2 is supplied with an alternating current from the inverter device 1. The motor 2 is controlled by the inverter device 1. The speed reducer 5 is connected to a rotor of the motor 2. The speed reducer 5 decelerates and outputs rotation of the motor 2.

Figure 2:
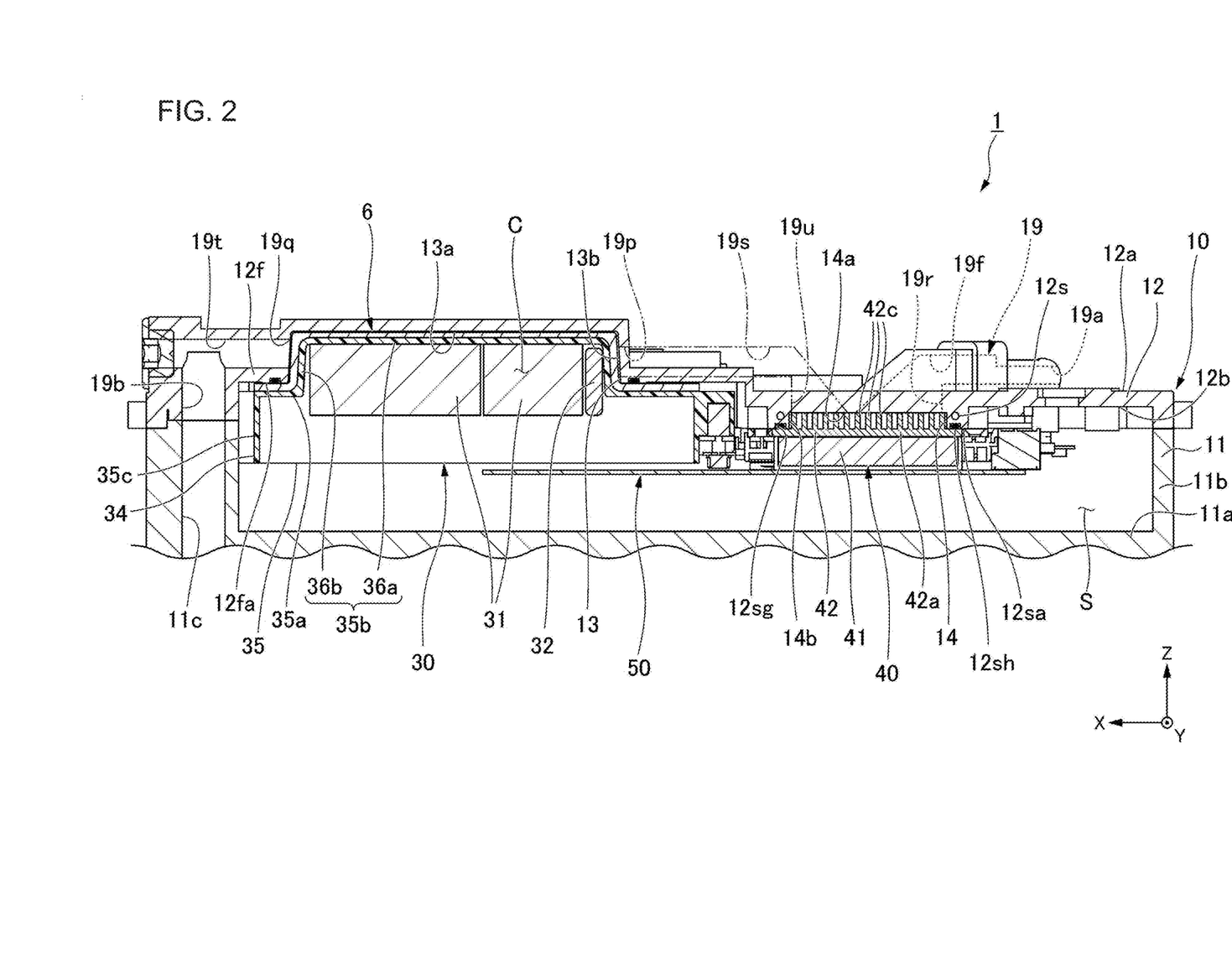
FIG. 2 is a sectional view of an inverter device according to an example embodiment.
Figure 3:
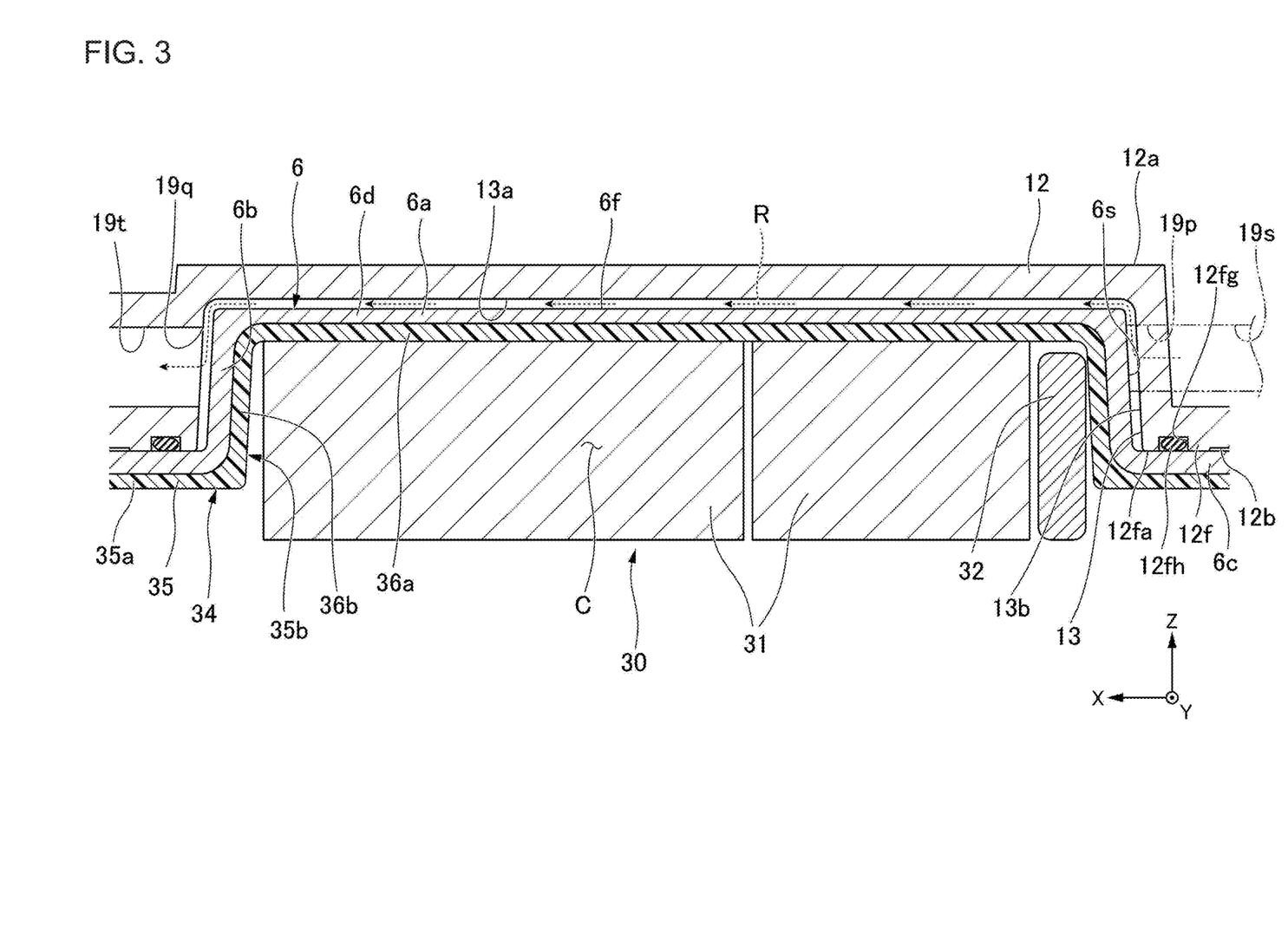
FIG. 3 is a partially enlarged schematic view of FIG. 2.

FIG. 2 is a sectional view of the inverter device 1. FIG. 3 is a partially enlarged view of FIG. 2.

FIG. 3 is a schematic diagram with a dimensional ratio different from that in FIG. 2 to explicitly show a flow of a refrigerant R.

Figure 4:
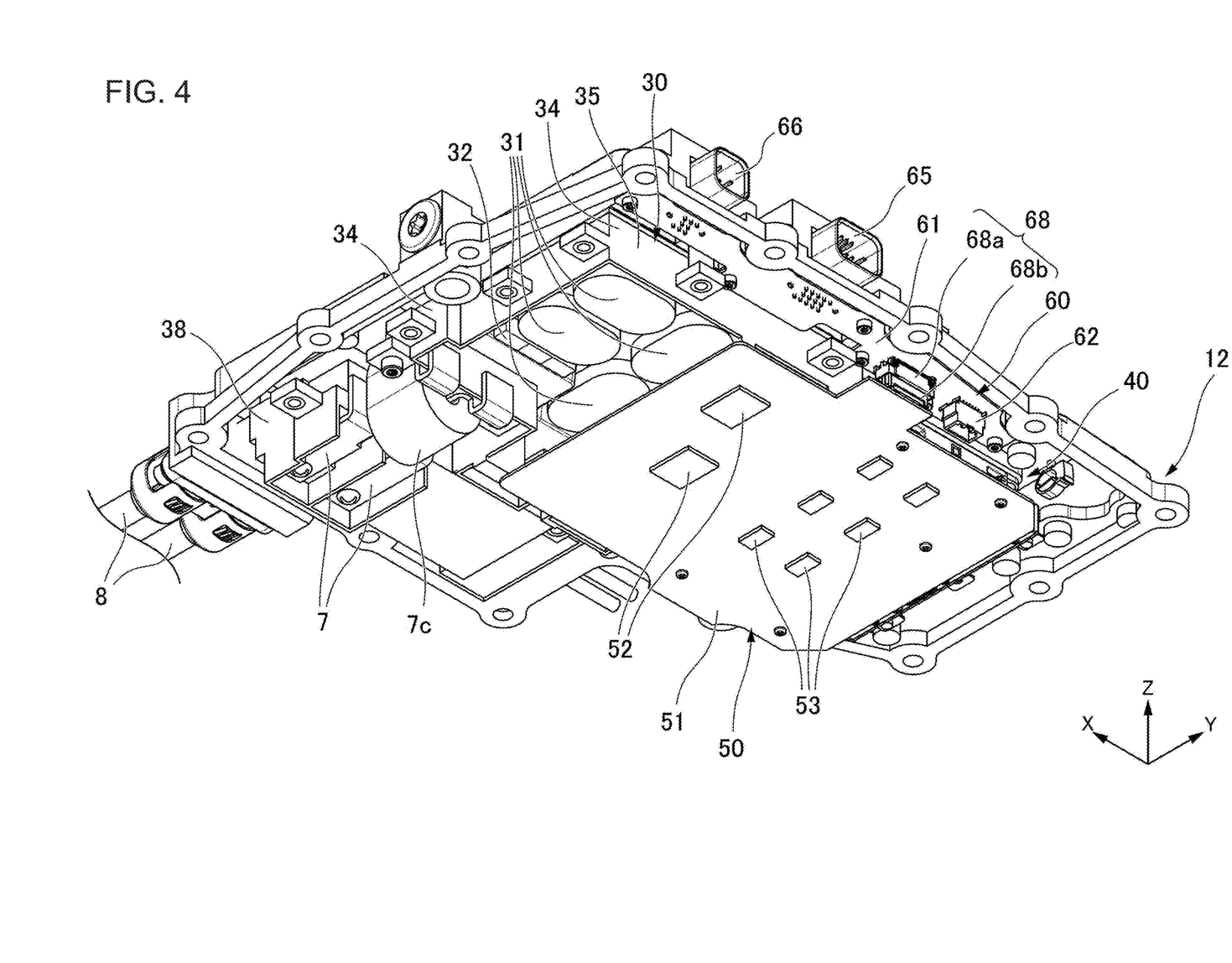
FIG. 4 is a perspective view illustrating an inverter device according to an example embodiment.

The inverter device 1 includes a housing 10, a capacitor module 30, a power module 40, and a main board 50. As illustrated in FIG. 4 described later, the inverter device 1 further includes a bus bar 7 and a sub-board 60.

As illustrated in FIG. 2, the housing 10 includes a housing body 11 and a cover portion (wall portion) 12. The housing body 11 and the cover portion 12 are each made of, for example, an aluminum alloy, and are each formed by casting such as die casting. The housing body 11 may be a part of the motor housing 4.

The housing body 11 opens upward. The housing body 11 has an upper opening covered with the cover portion 12. The housing 10 has a housing space S surrounded by the housing body 11 and the cover portion 12. In the housing space S, the capacitor module 30, the power module 40, the bus bar 7, the main board 50, and the sub-board 60 are housed. The capacitor module 30, the power module 40, the bus bar 7, the main board 50, and the sub-board 60 are fixed to the cover portion 12 inside the housing space S.

The housing body 11 has a bottom wall 11a extending along a horizontal plane and a side wall 11b protruding upward from an outer edge of the bottom wall 11a. The bottom wall 11a is located below the housing space S. The side wall 11b surrounds the housing space S from a horizontal direction. The cover portion 12 is fixed to an upper end surface of the side wall 11b.

The cover portion 12 extends along a plane orthogonal to the up-down direction. The cover portion 12 is provided with a flow path 19 through which a refrigerant flows. The refrigerant flowing through the flow path 19 cools the power module 40 and the capacitor module 30 disposed in the housing space S. The flow path 19 extends inside the cover portion 12 along the plane orthogonal to the up-down direction.

The flow path 19 has an upstream end 19a located upstream of the refrigerant flowing in the flow path 19 and a downstream end 19b located downstream thereof. The upstream end 19a is connected to a pipe (not illustrated) communicating with a cooler (not illustrated) for cooling the refrigerant. The downstream end 19b is connected to a sub flow path 11c provided in the side wall 11b of the housing body 11. The sub flow path 11c is connected to an oil cooler (not illustrated) below the inverter device 1. The refrigerant exchanges heat with oil circulating in the motor housing 4 in the oil cooler.

After being cooled by a cooler (not illustrated), the refrigerant of the present example embodiment passes through the cover portion 12 to cool the power module 40 and the capacitor module 30, and further passes through the oil cooler to cool the oil. After passing through the above course, the refrigerant returns to the cooler again and circulates through the same course.

The cover portion 12 has an upper surface 12a facing upward and a lower surface 12b facing downward. The lower surface 12b faces the housing space S. The lower surface 12b is provided with a first opening portion 13 and a second opening portion 14. That is, the cover portion 12 is provided with the first opening portion 13 and the second opening portion 14. The first opening portion 13 and the second opening portion 14 each open downward. The first opening portion 13 and the second opening portion 14 are disposed side by side along a surface direction of the cover portion 12. The first opening portion 13 and the second opening portion 14 each have a recessed shape recessed in a thickness direction (more specifically, an upper side) of the cover portion 12. The first opening portion 13 houses at least a part of the capacitor module 30. In contrast, the second opening portion 14 houses at least a part of the power module 40.

The first opening portion 13 and the second opening portion 14 are disposed in the course of the flow path 19. The first opening portion 13 and the second opening portion 14 each open a part of the flow path 19 toward the housing space S. The first opening portion 13 is disposed downstream of the second opening portion 14 in the flow path 19. The flow path 19 includes a first section 19f allowing the upstream end 19a to communicate with the second opening portion 14, a second section 19s allowing the second opening portion 14 to communicate with the first opening portion 13, and a third section 19t allowing the first opening portion 13 to communicate with the downstream end 19b. The refrigerant having flowed into the flow path 19 from the upstream end 19a passes through the first section 19f, the second opening portion 14, the second section 19s, the first opening portion 13, and the third section 19t in this order.

The first opening portion 13 has an inner wall surface including a first bottom wall surface (bottom wall surface) 13a facing the thickness direction (lower side in the present example embodiment) of the cover portion 12, and a first side wall surface (side wall surface) 13b extending in the thickness direction from the first bottom wall surface 13a.

The second section 19s and the third section 19t of the flow path 19 open in the first side wall surface 13b. Here, an opening to the second section 19s is referred to as a first inflow port 19p, and an opening to the third section 19t is referred to as a first outflow port 19q. The refrigerant flows into the first opening portion 13 from the first inflow port 19p and flows out from the first outflow port 19q.

As illustrated in FIG. 3, the lower surface 12b of the cover portion 12 is provided with a first pedestal portion 12f surrounding the periphery of the first opening portion 13. The first pedestal portion 12f protrudes downward. The first pedestal portion 12f has a first pedestal surface 12fa facing downward. The first pedestal surface 12fa is provided with a first recessed groove 12fg surrounding the periphery of the first opening portion 13. The first recessed groove 12fg opens downward. In the first recessed groove 12fg, a first seal member 12fh is disposed.

As illustrated in FIG. 2, the second opening portion 14 has an inner wall surface including a second bottom wall surface 14a facing the thickness direction (lower side in the present example embodiment) of the cover portion 12, and a second side wall surface 14b extending in the thickness direction from the second bottom wall surface 14a. The first section 19f and the second section 19s of the flow path 19 open in the second bottom wall surface 14a. Here, an opening to the first section 19f is referred to as a second inflow port 19r, and an opening to the second section 19s is referred to as a second outflow port 19u. The refrigerant flows into the second opening portion 14 from the second inflow port 19r and flows out from the second outflow port 19u.

The lower surface 12b of the cover portion 12 is provided with second pedestal portions 12s surrounding the periphery of the second opening portion 14. The second pedestal portions 12s each protrude downward. The second pedestal portions 12s each have a second pedestal surface 12sa facing downward. The second pedestal surface 12sa is provided with a second recessed groove 12sg surrounding the periphery of the second opening portion 14. The second recessed groove 12sg opens downward. In the second recessed groove 12sg, a second seal member 12sh is disposed.

Figure 5:
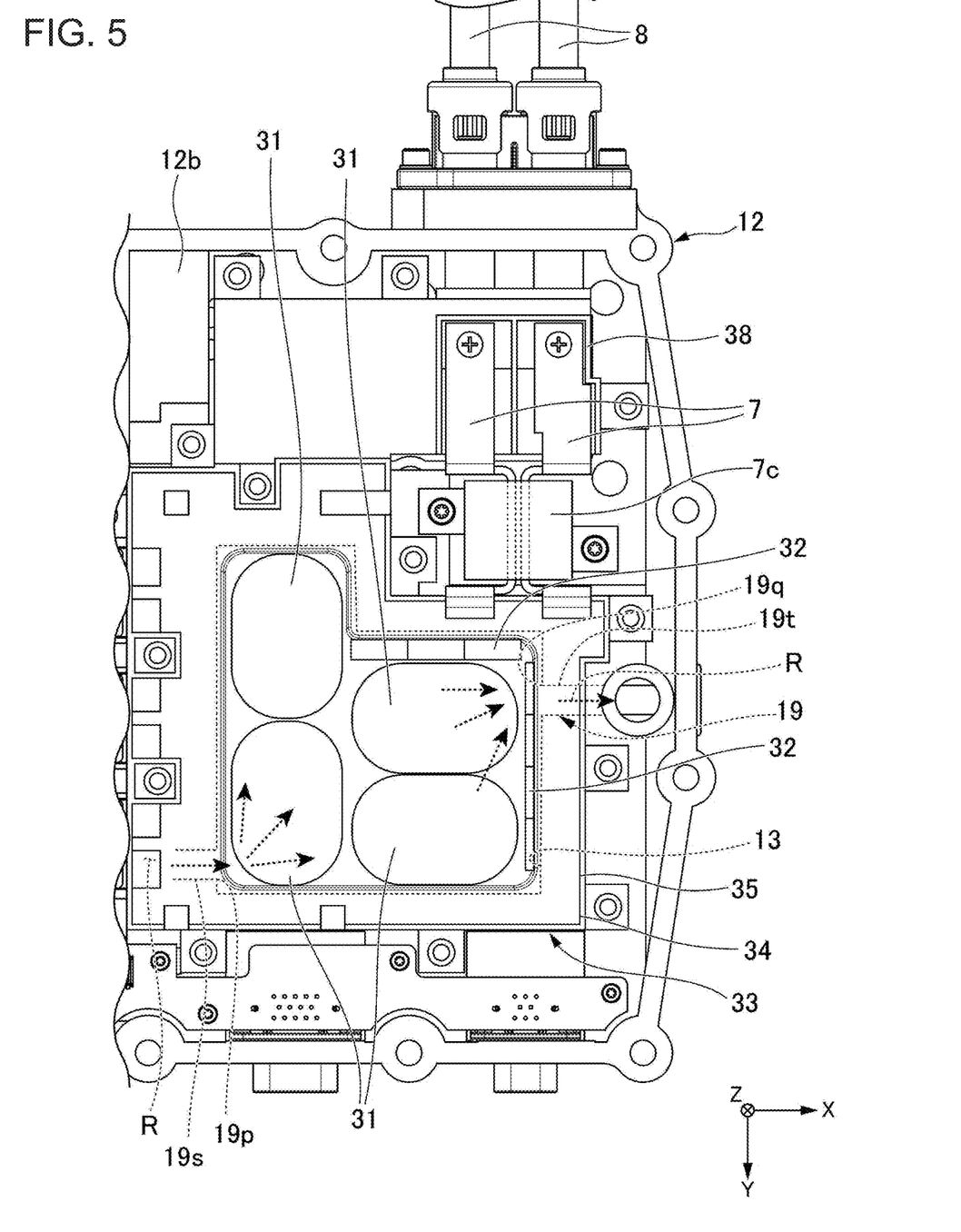
FIG. 5 is a plan view of an inverter device according to an example embodiment.

FIG. 4 is a perspective view illustrating the cover portion 12 and each unit of the inverter device 1 fixed to the cover portion 12. FIG. 5 is a plan view of a part of the inverter device 1 as viewed from below.

In FIGS. 4 and 5, a wiring portion or the like for electrically connecting the capacitor module 30 and the power module 40 is eliminated.

As illustrated in FIG. 5, the capacitor module 30 includes a first capacitor element (capacitor element) 31, a second capacitor element 32, and a capacitor case 33. The capacitor case 33 houses the first capacitor element 31 and the second capacitor element 32. The structure of the capacitor module 30 illustrated in FIG. 5 is an example, and the present disclosure is not limited thereto. At least one capacitor element may be housed in the capacitor case 33 of the capacitor module 30, and a plurality of capacitor elements or several kinds of capacitor element may not be housed in the capacitor case 33.

In the following description, when the first capacitor element 31 and the second capacitor element 32 are not distinguished from each other, they are simply referred to as capacitor elements 31 and 32.

First capacitor element 31 is an X capacitor. The first capacitor element 31 smooths power to be supplied to the power module 40. The first capacitor element 31 is supplied with a large current. Thus, the first capacitor element 31 generates a larger amount of heat than the second capacitor element 32. The first capacitor element 31 is cooled by the refrigerant. In the present example embodiment, the inverter device 1 is provided with four first capacitor elements 31.

The second capacitor element 32 generates less heat than the first capacitor element 31. The second capacitor element 32 is, for example, a Y capacitor. That is, the second capacitor element 32 is configured to remove switching noise of the power module 40. The second capacitor element 32 may be an X capacitor having a smaller capacitance than the first capacitor element 31.

The capacitor case 33 is fixed to the lower surface 12b of the cover portion 12 of the housing 10. The capacitor case 33 includes a case body 34 and a heat transfer portion 6 (see FIG. 3) disposed on an upper surface side of the case body 34. The case body is made of an insulating resin material.

As illustrated in FIG. 5, the case body 34 includes an element holder 35 that holds the capacitor elements 31 and 32, and a terminal block 38 that holds the bus bar 7.

The bus bar 7 connects a power supply terminal 8 and the capacitor module 30. A part of the bus bar 7 passes through a region surrounded by a magnet 7c for electromagnetic compatibility (EMC) between the power supply terminal 8 and the capacitor module 30.

The power supply terminal 8 extends from a battery (not illustrated) mounted on the vehicle. The power supply terminal 8 is connected to the bus bar 7 from a side surface of the inverter device 1. The inverter device 1 is supplied with a high-voltage direct current from a battery through the power supply terminal 8.

According to the present example embodiment, the capacitor case 33 includes the terminal block 38 that is made of resin and holds the bus bar 7. The bus bar 7 is connected to a power supply terminal extending from the outside, so that a high-voltage current also flows through the bus bar 7. When the bus bar 7 is held by the terminal block 38 made of resin, the step of connecting the bus bar 7 to the power supply terminal 8 can be easily performed while a short circuit between the bus bar 7 and other members is prevented. Additionally, when the capacitor case 33 is provided with the terminal block 38, the number of components can be reduced as compared with when another member is separately prepared.

As illustrated in FIG. 2, the element holder 35 of the case body 34 includes a main plate portion 35a extending along the plane orthogonal to the up-down direction, a recessed portion 35b recessed upward with respect to the main plate portion 35a, and a peripheral wall portion 35c protruding downward from an outer edge of a flat plate portion.

The peripheral wall portion 35c surrounds a wiring member (not illustrated) and the like of the capacitor module 30 from an outer periphery. The peripheral wall portion 35c secures a creepage distance between each part of the capacitor module 30 and an inner wall surface of the housing 10 to secure insulation between the capacitor module 30 and the housing 10.

The recessed portion 35b has a substantially constant plate thickness. Then, the recessed portion 35b protrudes upward in a protruding shape. The recessed portion 35b houses the capacitor elements 31 and 32. That is, the recessed portion 35b is provided inside with a capacitor element chamber C in which the capacitor elements 31 and 32 are disposed.

The recessed portion 35b includes a bottom plate 36a extending along the plane orthogonal to the up-down direction, and a side plate 36b extending downward from an outer edge of the bottom plate 36a. The bottom plate 36a faces the capacitor elements 31 and 32 in the up-down direction. The side plate 36b surrounds the periphery of the capacitor elements 31 and 32 from the outside.

The heat transfer portion 6 is made of a metal material having high heat conductivity. Examples of the material constituting the heat transfer portion 6 include an aluminum alloy and a copper alloy.

The heat transfer portion 6 is fixed to the element holder 35 of the case body 34. Examples of a method for fixing the heat transfer portion 6 to the case body 34 include crimping such as ultrasonic crimping or heat crimping. The heat transfer portion 6 may be fixed to the case body 34 by insert molding in which the heat transfer portion 6 is embedded in a part of the case body 34 during molding of the case body 34. When the heat transfer portion 6 is fixed to the case body 34 by insert molding, adhesion between the heat transfer portion 6 and the case body 34 can be enhanced, and thus heat transfer between the heat transfer portion 6 and the case body 34 can be easily enhanced.

As illustrated in FIG. 3, the heat transfer portion 6 has a plate-like shape. The heat transfer portion 6 is formed by, for example, a pressing process. The heat transfer portion 6 is configured to cover the main plate portion 35a and the recessed portion 35b of the element holder 35 from above.

The heat transfer portion 6 includes a flat plate portion 6c overlapping the main plate portion 35a of the element holder 35, and an insertion portion 6d overlapping the recessed portion 35b of the element holder 35.

The flat plate portion 6c is disposed around the first opening portion 13 as viewed from a plate thickness direction of the cover portion 12. The flat plate portion 6c has an upper surface facing the first pedestal surface 12fa in the up-down direction. The first seal member 12fh is sandwiched between the upper surface of the flat plate portion 6c and a bottom surface of the first recessed groove 12fg provided in the first pedestal surface 12fa. As a result, a region disposed inside the first seal member 12fh as viewed from the plate thickness direction of the cover portion 12 is sealed, and leakage of the refrigerant R is prevented.

The insertion portion 6d protrudes upward with respect to the flat plate portion 6c. The insertion portion 6d is inserted into the first opening portion 13 of the cover portion 12. Thus, the first opening portion 13 is covered with the heat transfer portion 6.

The insertion portion 6d includes a bottom portion 6a covering an upper surface of the bottom plate 36a of the element holder 35, and a side portion 6b disposed outside the side plate 36b. The bottom portion 6a is in the shape of a flat plate extending along the plane orthogonal to the up-down direction. The side portion 6b extends downward from an outer edge of the bottom portion 6a and is connected at its lower end to the flat plate portion 6c. The side portion 6b surrounds the side plate 36b of the recessed portion 35b from the outside.

The bottom portion 6a faces the first bottom wall surface 13a of the first opening portion 13 across a gap. Similarly, the side portion 6b faces the first side wall surface 13b of the first opening portion 13 across a gap. Here, an upper surface of the bottom portion 6a is referred to as a first facing surface 6f, and an outer peripheral surface of the side portion 6b is referred to as a second facing surface 6s. That is, the heat transfer portion 6 has the first facing surface 6f facing the first bottom wall surface 13a, and the second facing surface 6s facing the first side wall surface 13b.

The first side wall surface 13b of the first opening portion 13 is provided with the first inflow port 19p that allows the refrigerant R to flow into the first opening portion 13. The refrigerant R having flowed into the first opening portion 13 flows between the first bottom wall surface 13a of the first opening portion 13 and the first facing surface 6f of the heat transfer portion 6. The refrigerant R having flowed into the first opening portion 13 also flows between the first side wall surface 13b of the first opening portion 13 and the second facing surface 6s of the heat transfer portion 6. The refrigerant R in the first opening portion 13 flows out from a first outflow port 19q provided in the first side wall surface 13b of the first opening portion 13.

According to the present example embodiment, the first opening portion 13 of the cover portion 12 is covered with a part of the capacitor case 33, and the refrigerant R flows between the inner wall surface of the first opening portion 13 and the heat transfer portion 6. This allows the refrigerant R to come into direct contact with the capacitor module 30, thereby cooling the capacitor module 30. In other words, a part of capacitor case 33 serves as not only covering the first opening portion 13 but also cooling the capacitor module 30. As a result, the capacitor module 30 can be quickly and efficiently cooled by the refrigerant R.

According to the present example embodiment, the refrigerant R comes into contact with the heat transfer portion 6 of the capacitor case 33. The heat transfer portion 6 is made of metal having high heat conductivity, and thus is likely to be immediately reduced in temperature by cooling due to contact with the refrigerant R. The heat transfer portion 6 also has a large heat capacity, so that cooling effect is likely to continue. This enables the capacitor case 33 according to the present example embodiment to immediately and continuously cool the capacitor elements 31 and 32 housed inside.

In the present example embodiment, the heat transfer portion 6 made of metal is in contact with the case body 34 made of resin. The case body 34 is in contact with the capacitor elements 31 and 32 to hold the capacitor elements 31 and 32. This enables the capacitor case 33 to efficiently cool the capacitor elements 31 and 32 using the heat transfer portion 6 while insulation between the heat transfer portion 6 and the capacitor elements 31 and 32 is secured.

In the present example embodiment, the heat transfer portion 6 includes the bottom portion 6a and the side portion 6b that surround the capacitor element chamber C of the capacitor case 33, respectively, from above and from an outer peripheral side of the capacitor element chamber C. This enables the heat transfer portion 6 cooled by the refrigerant R to cool the inside of the capacitor element chamber C from above and from the outer peripheral side of the capacitor element chamber C. The heat transfer portion 6 of the present example embodiment enables cooling efficiency of the capacitor elements 31 and 32 disposed in the capacitor element chamber C to be enhanced.

According to the present example embodiment, at least a part of the capacitor module 30 is housed in the first opening portion 13 in a recessed shape. In general, the capacitor module 30 and the inverter device 1 are likely to increase in length in the up-down direction as the capacitor elements 31 and 32 housed in the capacitor module 30 increase in component size. In contrast, the present example embodiment enables a part of the capacitor module 30 to be embedded in the thickness direction of the cover portion 12 by housing the part of the capacitor module 30 in the first opening portion 13 in a recessed shape. This enables the inverter device 1 to be downsized in the up-down direction.

In the present example embodiment, the refrigerant R flows between the first bottom wall surface 13a and the first facing surface 6f, and between the first side wall surface 13b and the second facing surface 6s. That is, the refrigerant R cools not only one surface of the capacitor module 30 but also a plurality of surfaces thereof over a wide range. This enables the refrigerant R to quickly and efficiently cool the capacitor module 30. In the present example embodiment, the first opening portion 13 has a flow path of the refrigerant R, being provided so as to surround the capacitor element chamber C from above and from the outer peripheral side of the capacitor element chamber C. That is, the refrigerant R cools the capacitor elements 31 and 32 by surrounding the capacitor elements from a plurality of directions. This enables enhancing the cooling efficiency of the capacitor elements 31 and 32 using the refrigerant R.

FIG. 5 schematically illustrates a flow of the refrigerant R that flows into the first opening portion 13 through the first inflow port 19p and flows out from the first opening portion 13 through the first outflow port 19q. As illustrated in FIG. 5, the first inflow port 19p and the first outflow port 19q are disposed on a diagonal line of the first opening portion 13. This allows the refrigerant R passing through the first opening portion 13 to spread throughout each portion of the first opening portion 13.

As illustrated in FIG. 2, the power module 40 includes a switching element 41 and an element pedestal member 42. The element pedestal member 42 serves as a pedestal for fixing the switching element 41.

The power module 40 is disposed along the cover portion 12 of the housing 10. The power module 40 and the capacitor module 30 are disposed side by side along the surface direction of the cover portion 12. That is, the power module 40 and the capacitor module 30 are disposed adjacent to each other without overlapping each other as viewed from the thickness direction of cover portion 12.

In recent years, an electromechanical motor unit integrated with an inverter device has been developed. When such an inverter device increases in dimension in a height direction, a boarding space in a vehicle may be restrained. This requires development of a thinner inverter device. According to an aspect described in the present specification, a thinned inverter device is provided.

According to the present example embodiment, the power module 40 and the capacitor module 30 are disposed side by side along the surface direction of the cover portion 12, so that the inverter device 1 can be downsized in the thickness direction of the cover portion 12.

The switching element 41 of the present example embodiment is an insulated gate bipolar transistor (IGBT). The switching element 41 generates a larger amount of heat than the capacitor elements 31 and 32. The switching element 41 is cooled by a refrigerant.

The element pedestal member 42 is made of a metal material having high heat conductivity. Examples of the material constituting the element pedestal member 42 include an aluminum alloy and a copper alloy. The element pedestal member 42 functions to transfer heat from the switching element 41 to a refrigerant.

The element pedestal member 42 holds the switching element 41. The element pedestal member 42 includes a cover body 42a in a plate-like shape and a plurality of heat radiation pins 42c protruding upward from an upper surface of the cover body 42a. The cover body 42a has a lower surface that is in contact with and fixed to the switching element 41.

The cover body 42a has an upper surface covering the second opening portion 14. The upper surface of the cover body 42a faces the second pedestal surface 12sa in the up-down direction. The second seal member 12sh is sandwiched between the upper surface of the cover body 42a and a bottom surface of the second recessed groove 12sg provided in the second pedestal surface 12sa. As a result, a region disposed inside the second seal member 12sh as viewed from the plate thickness direction of the cover portion 12 is sealed, and leakage of the refrigerant is prevented.

A plurality of heat radiation pins 42c is disposed inside the second opening portion 14. The second bottom wall surface 14a of the second opening portion 14 is provided with a second inflow port 19r that allows the refrigerant to flow into the second opening portion 14. The refrigerant having flowed into the second opening portion 14 flows through a gap between the plurality of heat radiation pins 42c between the second bottom wall surface 14a of the second opening portion 14 and the upper surface of the cover body 42a. The refrigerant in the second opening portion 14 flows out from a second outflow port 19u provided in the second bottom wall surface 14a of the second opening portion 14.

According to the present example embodiment, the refrigerant flows between the inner wall surface of the second opening portion 14 and the element pedestal member 42. That is, the refrigerant comes into direct contact with the power module 40 to cool the power module 40. Additionally, the element pedestal member 42 cools the switching element. As a result, the refrigerant quickly and efficiently cools the power module 40.

According to the present example embodiment, the element pedestal member 42 includes the plurality of heat radiation pins 42c disposed in the second opening portion 14. The refrigerant passes between the plurality of heat radiation pins 42c. This enables securing a large contact area between the element pedestal member 42 and the refrigerant, so that the element pedestal member 42 can be efficiently cooled by the refrigerant.

In the present example embodiment, the capacitor module 30 generates a smaller amount of heat than the power module 40. Thus, the heat transfer portion 6 of the capacitor module 30 can sufficiently secure a contact area with the refrigerant for the amount of heat generation, and thus does not necessarily require a heat radiation pin as in the power module 40. However, when the heat transfer portion 6 is less likely to secure a sufficient contact area with the refrigerant for the amount of heat generated by the capacitor elements 31 and 32, the heat transfer portion 6 may be provided with a heat radiation pin.

In the present example embodiment, the second opening portion 14 is disposed upstream of the first opening portion 13 in the flow path 19. Thus, the refrigerant cooled in the cooler (not illustrated) cools the power module 40 in the second opening portion 14, and then cools the capacitor module 30 in the first opening portion 13. According to the present example embodiment, the power module 40 having a large amount of heat generation can be efficiently cooled by the refrigerant at low temperature.

As illustrated in FIG. 4, the main board 50 is disposed along the cover portion 12. The main board 50 overlaps the capacitor module 30 and the power module 40 as viewed from the thickness direction of the cover portion 12.

The main board 50 includes a board body 51, a microcomputer 52 mounted on the board body 51, and a gate driver integrated circuit 53.

The board body 51 extends along the plane orthogonal to the up-down direction. The microcomputer 52 and the gate driver integrated circuit 53 are mounted on a lower surface of the board body 51. The board body 51 is provided on the lower surface with a region where a plurality of microcomputers 52 is mounted and a region where a plurality of gate driver integrated circuits 53 are provided, the regions being adjacent to each other.

The microcomputer 52 is connected to the motor 2 to control the motor 2. The gate driver integrated circuit 53 controls the power module 40. According to the present example embodiment, the microcomputer 52 and the gate driver integrated circuit 53 are mounted on one main board 50.

Known conventional structures include a structure in which a control board on which a microcomputer is mounted and a power board on which a gate driver integrated circuit is mounted are prepared, and are disposed by being stacked together. According to the present example embodiment, the control board and the power board are integrated into one board (main board 50), so that the boards are not required to be disposed by being stacked together. This enables the inverter device 1 to be reduced in thickness. As compared with the conventional structures, wiring connecting the control board and the power board is unnecessary, and thus the number of components can be reduced.

The sub-board 60 is disposed along the cover portion 12. The sub-board 60 extends in one direction (X-axis direction) along an outer edge of the cover portion 12 as viewed from the plate thickness direction of the cover portion 12.

The sub-board 60 is disposed laterally to the capacitor module 30 and the power module 40. The sub-board 60 is disposed laterally to the capacitor module 30 and the power module 40 along the surface direction of the cover portion 12. Then, a part of the sub-board 60 overlaps the main board 50 as viewed from the plate thickness direction of the cover portion 12. That is, the sub-board 60 is disposed along the main board 50.

The sub-board 60 includes a sub-board body 61 and a filtering element 62. The sub-board body 61 extends along the plane orthogonal to the up-down direction. The filtering element 62 is mounted on a lower surface of the sub-board body 61.

The lower surface of the sub-board body 61 is connected to a male connector 68a. Similarly, an upper surface of the board body 51 of the main board 50 is connected to a female connector 68b. The male connector 68a and the female connector 68b overlap each other in the up-down direction and are connected to each other. The male connector 68a and the female connector 68b constitute an inter-board connector 68 that connects the sub-board 60 and the main board 50. That is, the inverter device 1 includes the inter-board connector 68 that connects the main board 50 and the sub-board 60 at a portion where the sub-board 60 and the main board 50 overlap each other in the plate thickness direction.

According to the present example embodiment, the main board 50 and the sub-board 60 are connected using the inter-board connector 68. Thus, the main board 50 and the sub-board 60 are not required to be connected to each other using a harness, so that an assembly process required for routing the harness can be simplified.

Two external connectors 65 and 66 are connected to an upper surface of the sub-board body 61. That is, the inverter device 1 includes the external connectors 65 and 66. The external connectors 65 and 66 are connected to respective terminals (not illustrated) extending from the outside. The respective terminals connected to the external connectors 65 and 66 are, for example, signal terminals for transmitting a command signal from the vehicle.

The filtering element 62 prevents switching noise due to on-off switching of the switching element 41 from being transmitted to a harness outside the inverter device 1 through the external connectors 65 and 66. In general, noise contained in an external signal is likely to be affected by a magnetic field of another member. Thus, configuration of the filtering element 62 is adjusted after placement and configuration of other members are determined. According to the present example embodiment, the filtering element 62 is provided on the sub-board 60. Thus, after configuration of other members of the inverter device 1 and each part of the motor unit 3 is determined, a noise filter can be adjusted by exchanging various sub-boards 60. This facilitates adjustment for the filtering element 62, so that the inverter device 1 with higher reliability can be configured.

The inverter device 1 of the present example embodiment includes the sub-board 60 for connecting the external connectors 65 and 66, separately from the main board 50. This enables the external connectors 65 and 66 to be directly connected to the sub-board 60 by disposing the sub-board 60 in accordance with placement of the external connectors 65 and 66. That is, the present example embodiment does not require a harness or the like for connecting a board to be connected to the external connectors 65 and 66, and thus enables reduction in the number of components.

The inverter device 1 of the present example embodiment is mounted on the motor unit 3. The motor unit 3 is mounted on a vehicle. As described above, the inverter device 1 of the present example embodiment is capable of efficiently cooling a capacitor. This enhances resistance to a large current used in the motor unit 3 and the vehicle. Additionally, the inverter device 1 of the present example embodiment can be downsized in the up-down direction, so that the motor unit 3 also can be downsized in the up-down direction. Thus, a space in which members other than the motor unit 3 can be disposed is widened also in the vehicle.

Although the example embodiment of the present disclosure has been described above, each structure in the example embodiment and a combination thereof are examples, and thus addition, elimination, replacement of structure, and other modifications can be made within a range without departing from the spirit of the present disclosure. Additionally, the present disclosure is not limited by the example embodiment.

For example, the example embodiment has been described above in which the first opening portion 13, the second opening portion 14, and the flow path 19 are provided in the cover portion 12. However, the first opening portion 13, the second opening portion 14, and the flow path 19 may be provided in another wall portion (bottom wall 11a, side wall 11b) of the housing 10.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inverter device comprising:
a capacitor module including a capacitor element and a capacitor case that houses the capacitor element; and
a housing having a housing space for housing the capacitor module,
the housing including a wall portion that is provided with a flow path through which a refrigerant flows and a first opening portion that allows a part of the flow path to open toward the housing space,
the capacitor case including a heat transfer portion that is made of metal and configured to cover the first opening portion,
the housing including a first inflow port that is open to the first opening portion at a gap which is defined between the wall portion and the heat transfer portion, and
the refrigerant flowing between an inner wall surface of the first opening portion and the heat transfer portion.

2. The inverter device according to claim 1, wherein
the first opening portion has a recessed shape recessed in a thickness direction of the wall portion, and houses at least a part of the capacitor module,
the inner wall surface of the first opening portion includes a bottom wall surface facing the thickness direction of the wall portion, and a side wall surface extending from the bottom wall surface in the thickness direction,
the heat transfer portion includes a first facing surface facing the bottom wall surface, and a second facing surface facing the side wall surface, and
the refrigerant flows between the bottom wall surface and the first facing surface, and between the side wall surface and the second facing surface.

3. The inverter device according to claim 1, further comprising:
a power module,
wherein the capacitor module and the power module are disposed side by side along a surface direction of the wall portion.

4. The inverter device according to claim 3, wherein
the wall portion is provided with a second opening portion that allows a part of the flow path to open toward the housing space,
the power module includes a switching element and an element pedestal member made of metal that holds the switching element and that is configured to cover the second opening portion, and
the refrigerant flows between an inner wall surface of the second opening portion and the element pedestal member.

5. The inverter device according to claim 1, further comprising:
a main board on which a microcomputer and a gate driver integrated circuit are mounted,
wherein the main board is disposed along the wall portion.

6. The inverter device according to claim 5, further comprising:
an external connector to which a terminal extending from an exterior is connected;
a sub-board to which the external connector is connected, the sub board being disposed along the main board; and
an inter-board connector that connects the sub-board and the main board at a portion where the sub-board and the main board overlap in the plate thickness direction.

7. The inverter device according to claim 1, further comprising:
a bus bar to which a power supply terminal extending from the exterior is connected,
wherein the capacitor case includes a terminal block made of resin that supports the bus bar.

8. A motor unit comprising the inverter device according to claim 1.

9. A vehicle comprising the motor unit according to claim 8.

* * * * *